COMBINED SIGNAL SEEKING PUSH BUTTON AND MANUAL TUNER

Filed March 9, 1956 4 Sheets-Sheet 1

INVENTORS
George M. Gaskill &
BY Manfred G. Wright
R. E. Fowler
ATTORNEY

COMBINED SIGNAL SEEKING PUSH BUTTON AND MANUAL TUNER

Filed March 9, 1956

4 Sheets-Sheet 2

INVENTORS
George M. Gaskill &
BY Manfred G. Wright
R. E. Fowler
ATTORNEY

Sept. 23, 1958 G. M. GASKILL ET AL 2,852,944

COMBINED SIGNAL SEEKING PUSH BUTTON AND MANUAL TUNER

Filed March 9, 1956 4 Sheets-Sheet 3

INVENTORS
George M. Gaskill &
BY Manfred G. Wright
R. E. Fowler
ATTORNEY

Sept. 23, 1958 G. M. GASKILL ET AL 2,852,944

COMBINED SIGNAL SEEKING PUSH BUTTON AND MANUAL TUNER

Filed March 9, 1956 4 Sheets-Sheet 4

INVENTORS
George M. Gaskill &
BY Manfred G. Wright
R. E. Fowler
ATTORNEY

United States Patent Office 2,852,944
Patented Sept. 23, 1958

2,852,944

COMBINED SIGNAL SEEKING PUSH BUTTON AND MANUAL TUNER

George M. Gaskill and Manfred G. Wright, Kokomo, Ind., assignors to General Motors Corporation, Detroit, Mich., a corporation of Delaware Application March 9, 1956, Serial No. 570,604

15 Claims. (Cl. 74—10)

This invention relates to means for tuning radio apparatus and more specifically to provide combination tuning means permitting manual operation, manual preset specific station indexing and automatic indexing means operable upon the arrival of a signal in the apparatus.

In the early days of radio communication the tuning of radio apparatus over a predetermined band for which the equipment was designed was accomplished by manually moving adjustable apparatus for tuning. At some later date mechanical adjustable means was provided which could be preset and locked to move the tuning means quickly to given locations to tune in a plurality of preselected and most frequently used stations. Following that, tuning equipment was designed to scan a frequency band and automatically cause the tuning means to stop or index upon the arrival of a tuned signal from a given station. This latter type of equipment has been identified as "signal seeking" tuning means or "stop-on-signal" apparatus. In order to obtain the benefits and advantages of all of the various types of tuning, it is desired to combine in one unitary means the various previously mentioned types of tuning mechanisms.

It is therefore an object in making this invention to provide means for tuning radio apparatus over a prescribed band which may be operated manually, mechanically or automatically.

It is still a further object in making this invention to provide radio tuning means which can be indexed either automatically by the arrival of an incoming signal or mechanically by preset adjustable means.

It is a still further object in making this invention to provide radio tuning means for controlling the movement of the tuning apparatus which is a combination of manual, mechanical preset, and signal seeking action, any one of which can be operated immediately without the necessity for selecting or adjusting any part to provide the desired operation.

With these and other objects in view which will become apparent as the specification proceeds, our invention will be best understood by reference to the following specification and claims and the illustrations in the accompanying drawings, in which:

Figure 1 is a top plan view of the combination radio tuner embodying our invention;

Figure 1*a* is an enlarged sectional view through a side frame member showing the shaft bearing support.

Figures 1, 10:
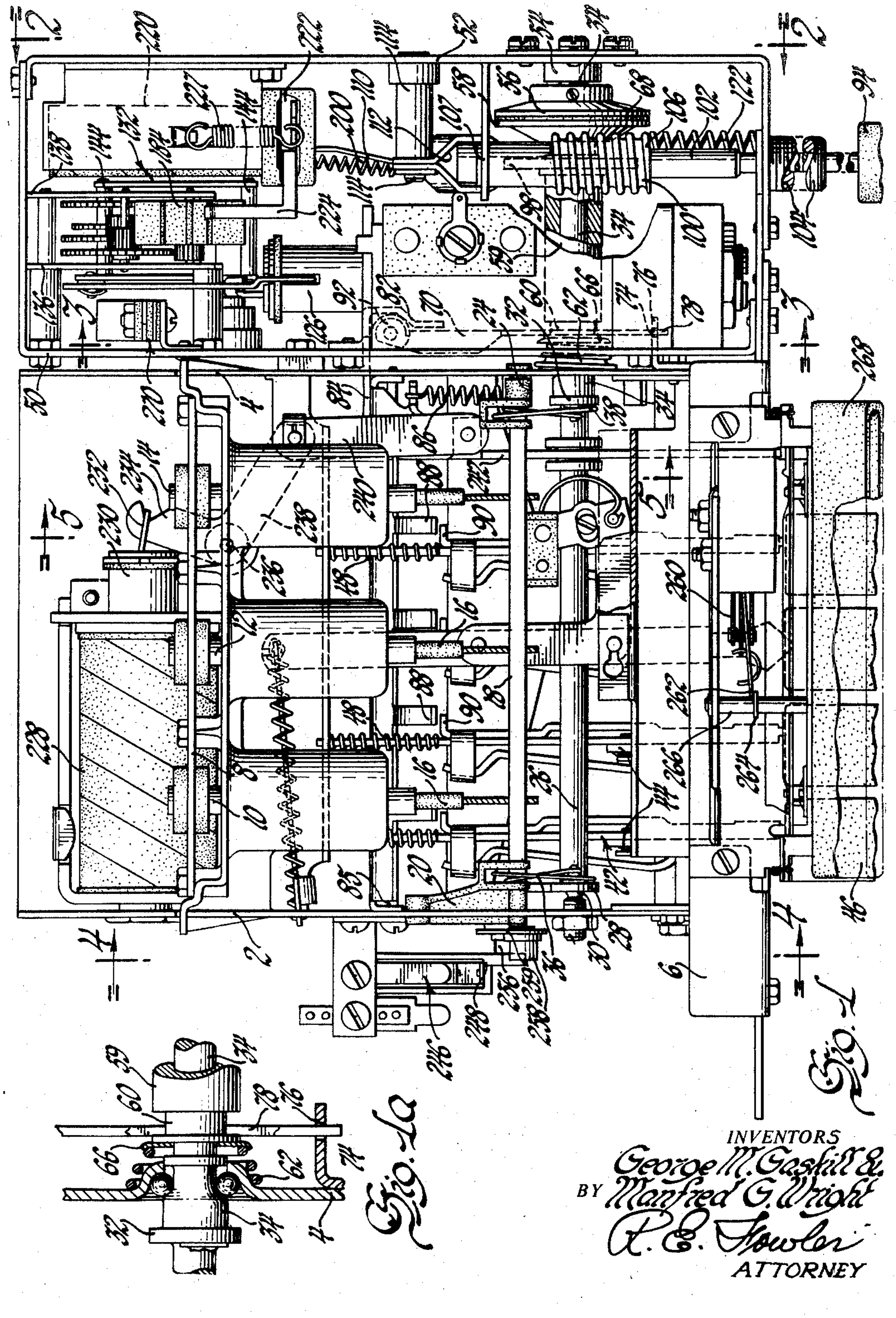

Referring now more particularly to Figure 1 of the drawings, that portion shown in the left section of Figure 1 constitutes a mechanical push button tuner embodying cams which can be preset to mechanically index the tuning means to certain desired stations. That portion on the right of Figure 1 provides the signal seeking scanning mechanism with its associated indexing portion together with a manual drive whereby the tuning means can be adjusted by hand. The mechanical push button tuning portion mounts the actual means for tuning the radio receiver. This portion includes a framework consisting of side members 2 and 4 which extend longitudinally of the means and are held together by a plurality of transverse members such as front member 6 forming in general a box type enclosure. Mounted on a transverse member 8 of this framework are a plurality of tuning means including inductance coil assemblies 10, 12 and 14 whose inductance may be changed or altered by the insertion or withdrawal of a plurality of comminuted iron cores 16 which are commonly adjustably mounted on a transverse bar 18. These three coils 10, 12 and 14 are connected electrically in the antenna, oscillator and RF portions of the radio receiver to tune the same to incoming stations. As the transverse bar 18 moves back and forth on the framework the inductance of the tuning coils is changed to scan the band.

Figure 4:
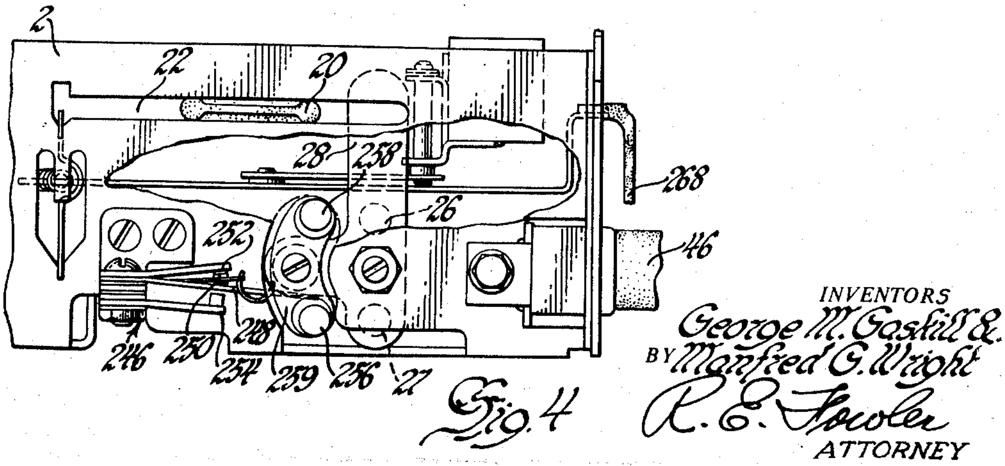
Figure 4 is a partial side elevational view taken from the left of Figure 1 on the line 4—4.
Figure 5:
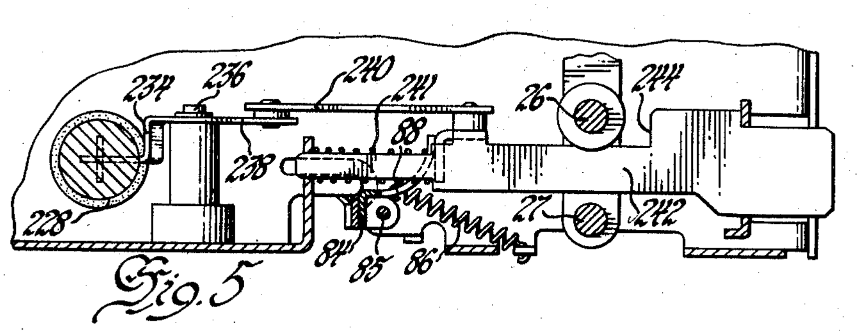
Figure 5 is a sectional view taken on the line 5—5 of Figure 1.

The transverse bar 18 is supported on one end by a plastic member 20 to which the left-hand end of the bar 18 is secured, which plastic member rides in a slot 22 in the left-hand frame member 2, as shown in Figure 4. In similar manner the right-hand end of the transverse bar 18 is connected to a plastic or insulating end support 24 which rides in a similar slot in the side frame member 4. A rotatable spaced rod assembly is pivotally supported between the two side frame members 2 and 4 to drive the transverse bar 18. This rod assembly consists of a pair of transverse spaced rods only one of which is visible from the top in Figure 1, and is shown at 26, the other transverse rod 27 being located below slide assemblies, as shown in Figure 5, and forming with end members a treadle bar construction, the slide assemblies projecting through the opening between the two. This type of tuner per se forms no part of the present invention and the construction of the treadle bar and slide assemblies is fully shown and described in Patent No. 2,494,008 to Schwarz, dated January 10, 1950.

The left end member 28 of the treadle bar or rod assembly is pivoted on the side wall 2 about a point 30 at the center of the distance between the two transverse rods 26 and 27 (see Fig. 4). The opposite end member 32 is connected to a rotary shaft 34 mounted on bearings in the side wall 4 of the frame. Both end members 28 and 32 extend for some distance above the top rod 26 and each supports a coupling link 36 and 38 connected respectively to portions of the insulating plastic ends 20 and 24 of the transverse bar assembly. Biasing spring means 40 is provided in each instance to hold the coupling link means 38 and 36 pivotally secured to the bar assembly.

On each of the slide assemblies indicated generally at 42 there is mounted an adjustable cam 44 which is adapted to engage the rod assembly and turn it about its pivot for indexing purposes as described in the above-identified patent. The slide assemblies project from the front of the housing or frame and to the end of each there is applied a manually engageable push button 46. The slide assemblies are biased to hold them in their foremost position by biasing springs 48 mounted around the rear portion of the slide assembly and bearing on a transverse member in the frame. Thus when any one of the push buttons is depressed, the associated adjustable cam 44 on its associated slide engages the treadle bar or rod assembly, turning it about its pivot until the two sides of the cam simultaneously engage the rods 26 and 27 to bring the assembly to a predetermined point and the tuning means to a preset frequency.

A second frame, housing in general the signal seeking tuning drive and indexing means and also the manual drive means, is secured to the first side frame member 4 and consists of two right angle sections 50 and 52, forming a rectangular open frame. The shaft 34 extends through the side frame member 4 and under the side member 50 into the central compartment of the opening formed by the second frame members, and has its extreme end supported in a bearing 54 on the far wall 52. A first clutch disc 56 is rigidly secured to the end of the shaft 34 and always rotates therewith. A second spaced clutch means 58 is loosely mounted around said shaft on an elongated sleeve member 59, which sleeve member has a circumferential depression 60 adjacent the left-hand end as viewed in Figure 1. A compressed spring 62 surrounds the shaft 34 and bears against the side frame member 4 and also against an enlarged flange 66 on the inner end of the sleeve to force the two clutch parts 58 and 56 together. A layer of friction material 68 may be attached to either the face of clutch part 56 or 58 to provide satisfactory friction drive between the two.

Figure 3:
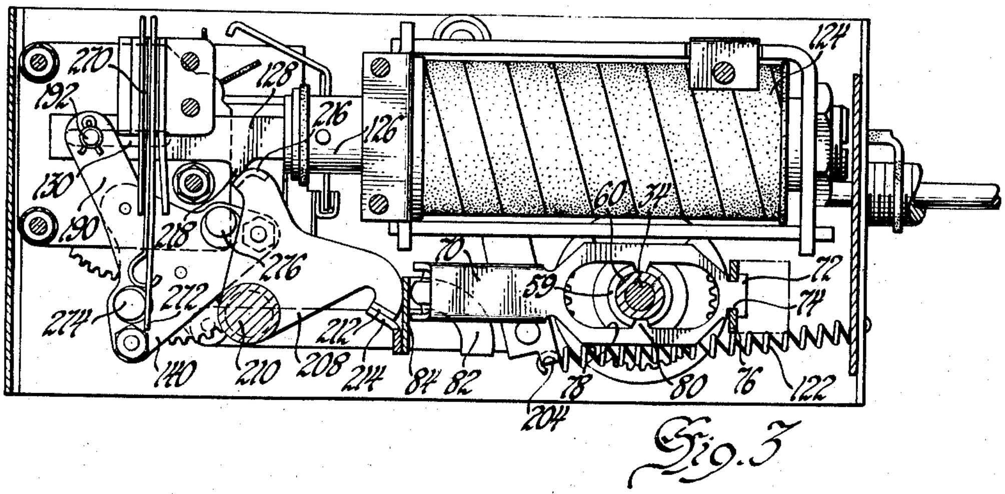
Figure 3 is a sectional view taken on the line 3—3 of Figure 1.

Clutch operating means includes a clutch actuating lever 70 which has its end 72 pivoted in an opening or slot 74 in a bracket 76 extending from side frame member 4. The lever 70 has a central opening 78 through which the shaft 34 extends, as best shown in Figure 3. The opening 78 is provided with diametrically opposed teeth 80 which extend into the depressed groove 60 of the sleeve 59. Thus pivotal movement of the lever 70 about its pivot in slot 74 will bring axial pressure on the sleeve 59 to cause it to move against the force of the biasing spring 62. The clutch operating lever 70 is actuated by a cam arm 82 which is an integral part of a transverse rotatably mounted member 84. This member 84 is rotatably mounted on a rod 85 extending between the side members 2 and 4 and biased toward the front of the tuner by spring 86, one end of which is connected to the upper end of the member 84 and the other to the frame, as shown in Figures 1 and 5. This tends to hold the clutch actuating cam 82 in inoperative position shown in dotted lines in Figure 1. This rotatable transverse member 84 is also provided with a plurality of curved actuating fingers 88, each located adjacent one of the slide assemblies. Each slide assembly includes a projecting foot 90 adapted to engage its associated finger 88, causing the transverse member 84 to be rotated when any one of the slide assemblies is depressed. This rotation of the transverse member 84 causes the bevelled surface of the cam arm 82 to ride up on roller 92, rotatably mounted on the end of the lever 70, and move the same to the left as shown in Figure 1 to pull the clutch faces apart and de-clutch.

The drive for the rod assembly inaugurated by either the manual knob or by the signal seeking power drive is provided through a worm 100 which is so mounted to act, when manual drive is desired, as a worm wheel drive, but when the signal seeking power drive is utilized, to act as a rack drive. A driving gear 98 is provided firmly affixed to the sleeve 59 carried by the clutch member 58 loosely mounted on the shaft 34. This gear 98 is adapted to mesh with the worm 100. The worm 100 is rigidly mounted on a shaft 102 which extends through a bushing 104 mounted in the front panel of the housing and is adapted to have mounted on its outer end a manually engageable knob 94. The opposite end of the shaft 102 beyond the worm 100 is supported for both reciprocal and rotary motion in an opening 106 in a supporting arm 107 projecting inwardly from the frame member 52. Thus as the shaft 102 is rotated, the worm teeth will drive the gear 98, whereas if the shaft is pushed inwardly or pulled outwardly, the rack action will likewise turn the gear 98 to tune the receiver by rotating the shaft 34. The inner end of the shaft 102 is of reduced diameter to provide a peripheral groove 108 adjacent the inner terminus of the shaft. A pivoted saddle assembly 110 formed of two parts which are bent away from each other to form a central opening 112 is pivoted at its upper extremity on pin 114 extending from side frame member 52.

Figure 2:
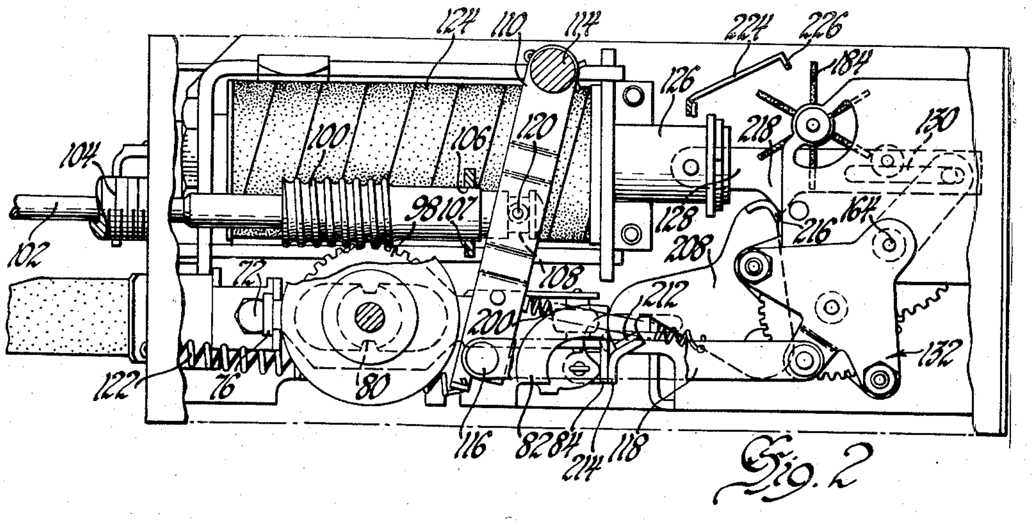
Figure 2 is a side elevational view taken from the right-hand side of Figure 1 on the line 2—2 of that figure.

The end of the shaft 102 is adapted to project into this central opening 112 in the two-member assembly 110 providing a supporting saddle, and below the shaft 102 the members are again bent toward each other and commonly pivotally secured at 116 to a connecting link 118 which extends to a power driven scanning means for the signal seeking tuner. At the center of the saddle opening 112 there are provided two diametrically opposed pins 120 which project into the groove 108 adjacent the end of the shaft 102 to provide a coupling means whereby the signal seeking scanner means can pull the shaft inwardly or push it outwardly, but which permits the rotation of shaft 102 for manual drive when desired. The signal seeking scanning action or drive is provided by a loaded spring 122, one end of which is connected to the lower end of the saddle assembly 110 and the opposite end to the frame. This tends to pull the saddle assembly forward, thus causing the gear 98 to rotate in a counterclockwise direction as viewed in Figure 2. To load the spring an electric solenoid is utilized and the cocking coil 124 is supported on the frame 50 by suitable bolts. When energized, the solenoid attracts a plunger 126, pulling it into the coil 124 to provide the necessary mechanical movement. The core or plunger 126 has a link member or slide 128 secured to its end which extends toward the rear of the tuner and includes an elongated slot 130 therein, best shown in Figure 3, which provides a lost motion coupling connection to the planetary drive of the tuner.

Figure 7:
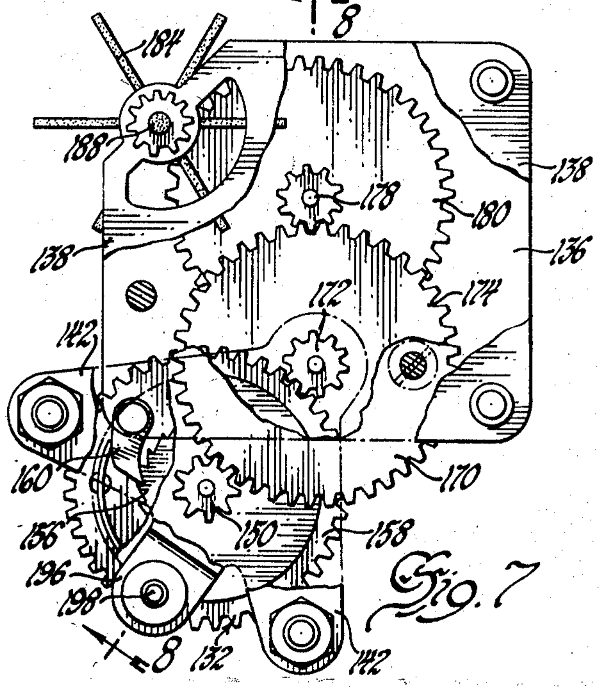
Figure 7 is an enlarged view of the planetary carriage and gear train governing the speed of the signal seeking tuner.
Figure 8:
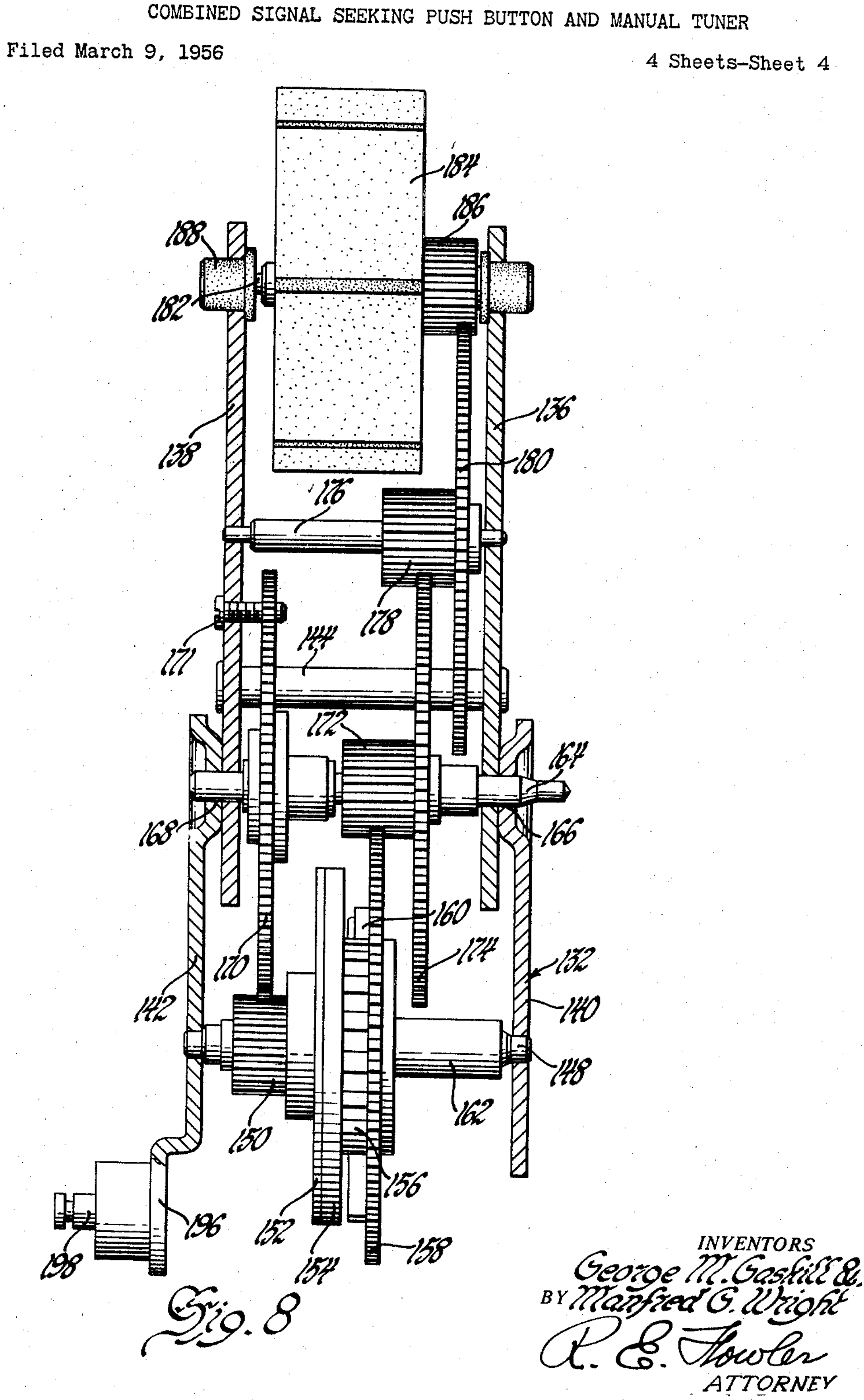
Figure 8 is a still further enlarged sectional view taken on the line 8—8 of Figure 7.

A pivoted planetary carriage 132 carries a part of the gear train load. The planetary carriage is pivotally mounted about an axis on a stationary frame which includes spaced plates 136 and 138 mounted on the side frame member 50. The gear train and stationary frame and planetary carriage are best shown in detail in enlarged Figures 7 and 8. The planetary carriage includes two spaced side frame members 140 and 142 secured together by suitable bolting and spacing means 144, as shown in Figure 1. Shaft 148 is trunnioned in said side frame members 140 and 142 and has fixedly secured thereon a pinion 150. The pinion has rigidly secured to it and mounted next in order on said shaft 148, a clutch member 152. A second clutch plate 154 is mounted adjacent the first and is loose on the shaft. A ratchet wheel 156 is secured to the clutch plate 154 to rotate therewith. A large spur gear 158 is next loosely mounted on the shaft and carries a pawl 160. The pawl cooperates with the ratchet wheel 156 to drive the same in one direction but to move over the surface of the teeth when the two parts rotate relatively in the opposite direction. This provides a one-way drive. A flange and sleeve 162 are lastly secured on shaft 148 and pressed against the gear 158 during assembly to exert axial pressure on gears 158 and 156 to press the clutch plates 154 and 152 into driving connection.

A shaft 164 extends through side plates 136 and 138 of the stationary frame and also through aligned openings 166 and 168 of the side frame members 140 and 142 of the pivotal carriage 132. This forms an axis about which the planetary carriage may rotate. A large spur gear 170 is loosely mounted on the shaft 164 but held against rotation by locking screw 171 in side plate 138. This gear 170 meshes with pinion 150 on shaft 148. A pinion 172 and spur gear 174, rigidly connected together, are also mounted on shaft 164, the pinion 172 meshing with gear 158 on shaft 148. A second spaced parallel shaft 176 is mounted for rotation in side plates 136 and 138 of the stationary frame. On this shaft are mounted pinion 178 and gear 180, rigidly secured together, which form the next reduction stage in the gear train. A final spaced shaft 182, parallel to shafts 176 and 164, carries the air vane governor 184 which is mounted on said shaft 182 to rotate therewith. Pinion 186, also mounted on this shaft and affixed thereto, meshes with driving gear 180, which provides the driving force. Shaft 182 is trunnioned in the side plates 136 and 138 by suitable bearings 188. The side plate 140 of the planetary carriage has an elongated extension 190 (see Figure 3) which projects into juxtaposition with the end of the slot 130 in the slide 128. A pin 192, rigidly secured to the end of the extension 190, projects into the elongated slot 130 of the slide 128 and provides a lost-motion coupling connection between the cocking solenoid 124 and the planetary carriage 132.

The connecting link 118 from the saddle 110 is pivotally connected to an extension 196 on the opposite side plate 142 of the planetary carriage at 198. The opposite end of this link 118, as previously described, is likewise pivotally connected at 116 to the lower end of the saddle 110. A spring 200 is connected between the link 118 and the saddle assembly 110 by having one end coupled through an opening 202 in the link 118 and the opposite end connected to the saddle member 110 below the pivots 120. In order to provide power to turn the planetary gear carriage 132, the spring 122 previously described provides a bias, pulling the saddle assembly toward the front of the casing, since it is connected to the lower end of the saddle assembly at point 204. The movement of the saddle assembly about its pivot on pin 114 causes longitudinal movement of the worm 100, and since that worm meshes with gear 98 on the sleeve 59 of the clutch member 58, rotation of the gear 98 causes clutch plate 58 to rotate. If this is in driving connection with clutch plate 56 at the time, then the rod assembly 26, 27 will be turned and the set tuned. For power drive, therefore, the loaded spring 122 provides power to move the tuning means in one direction during signal seeking action and the solenoid 124, when energized, turns the saddle assembly 110 in the opposite direction by means of the slide 128, planetary gear carriage 132 and link 118 to cock or load the spring 122.

The return movement powered by the solenoid, however, does not move the tuning mechanism in any way, since energization of the solenoid 124 opens clutch 58—56 and therefore permits the planetary carriage and its linked saddle assembly and worm to return to the opposite limit of its movement without moving the tuning means. This is provided through clutch actuating means as follows. A pivoted sector member 208 is pivotally mounted in one corner at 210 to the frame member 50 (see Figure 3). This member 208 has two angularly positioned flanged feet 212 and 216. The flanged foot 212 extends to a position adjacent a projecting flange 214 secured to one side of the pivoted transverse clutch actuator 84. When member 208 rotates in a clockwise direction, as shown in Figure 3, foot 212 presses against extension 214 and rotates actuator 84 to open the clutch 56—58 in a manner previously described. The opposite corner of the pivoted sector member 208 in provided with a foot 216 which extends to a position in the path of a projection 218 on slide 128. When the coil 124 is energized to attract its core 126, pulling slide 128 to the right as shown in Figure 3, projection 218 encounters the foot 216, causing member 208 to rotate in a clockwise direction, as shown in Figure 3, and operate the clutch, uncoupling the same. At the same time, of course, the slide 128, through its loose connection to driving pin 192 of arm 190, causes the planetary carriage 132 to rotate in a clockwise direction to load the spring 122.

In order to provide indexing means to stop the scanning action when the tuner reaches a point of resonance with a carrier, a control relay 220 is mounted on the side frame member 52. This relay is provided with an armature 222 pivotally mounted on the front wall and having secured to one side thereof a pawl or finger 224 which extends over the periphery of the air vane governor 184. The end of the finger 224 is bent downwardly at 226 so that when the relay is deenergized a spring 227 moves the armature 222 to move the finger into the path of the ends of the blades and therefore physically stops any further rotation of the governor. On the other hand, when the relay is energized it pivots the armature against the force of the spring 227 in such a way as to lift the end of the arm 224 and its extension 226 out of the path of the governor 184 and permit the same to rotate. The relay may be operated by any of various types of control circuits providing a stopping pulse to deenergize a relay when the carrier wave is tuned in.

In like manner, similar means are provided to move the tuning means back to the opposite end of the band when it has been moved to the front limit of travel. This means includes an actuating solenoid coil 228 and its associated reciprocating core 230, which assembly is mounted on the back portion of the frame behind the tuning coils 10, 12 and 14, as shown in Figure 1. The end of the solenoid plunger 230 is connected at 232 with one arm 234 of a bell crank lever pivoted at 236 to the frame. The other arm 238 of the bell crank is pivotally connected to a transverse link 240, pivotally connected in turn to a separate slide 242 reciprocable in the framework (see Figure 5). This slide 242 is not provided with a manual plunger and is used only for moving the tuning means back to its limit position. The slide is spring biased forwardly by spring 241, as shown in Figure 5. When the solenoid is energized, this slide is pulled toward the rear by the bell crank and linkage just described. This slide extends through the rod assembly and has an elevated portion 244 adapted to engage the upper rod 26 of the rod assembly when pulled to the rear, and therefore causes the rod assembly to be turned counterclockwise as shown in Figure 5, moving the cores into their associated coils.

The solenoid is energized and deenergized by movement of a limit switching means 246, best shown in Figure 4, consisting of a snapover center actuating arm 248 which moves a center insulated contact 250 between two outer stationary contacts 252 and 254 for desired switching. The actuating arm 248 is moved by short stub shafts 256 and 258 mounted on an arcuate member 259 secured to the end member 28 of the rod assembly and throwing the actuating arm in opposite directions at opposite limits of movement of the tuning means. Thus by connecting the switching means 246 in circuit with the actuating solenoid 228, when the rod assembly reaches the foremost position of movement the switch arm 248 is thrown to close contacts 250—254, energizing coil 228. This causes the core 230 to be drawn in and moves the slide 242 inward to move the tuning means to the low frequency end of the band. When the rod assembly has rotated to that position, the other stub shaft actuator 258 will engage the actuating arm 248, open the contacts 250—254 to deenergize the relay, and close contacts 250—252.

In the use of the tuning mechanism described as a signal seeking tuner, it is necessary to provide a manually operated switch to initially energize the control relay 220 and pick up detent 224 so that the tuning means may move off station. It will then continue movement until it reaches another carrier signal. The manual switching means initiating signal seeking tuning is shown at 260. It is a switch which is normally open but which is closed when depressed manually, but does not stay closed, returning to open position as soon as pressure is removed. The actuating arm 262 engages a collar 264 on a shaft 266 connected to a depressable bar 268 in the front of the frame. When this bar is depressed the collar 264 is moved toward the rear, snapping the switch 260 to closed position, and since this is connected in a series circuit with the control relay 220, will cause energization thereof, removing the detent 226 from the air fan governor and allowing the spring drive to move the tuner.

Figure 6:
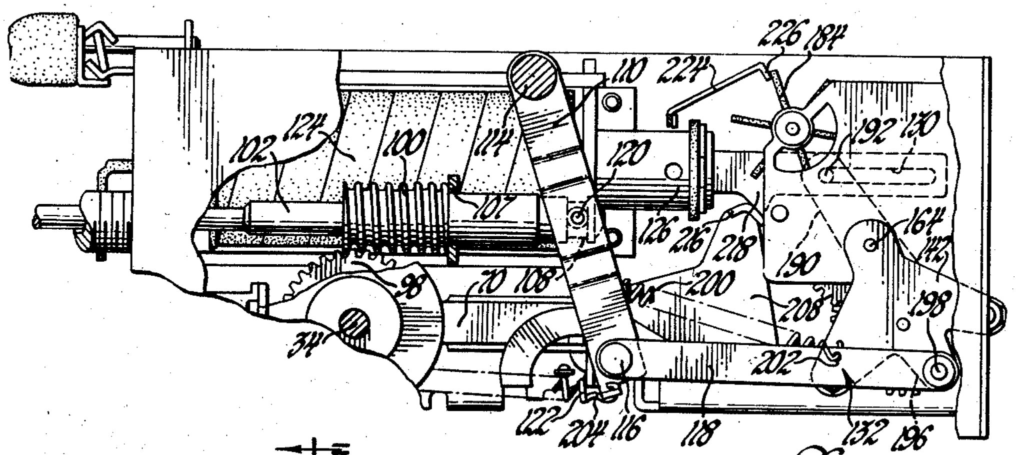
Figure 6 is a side elevational view of the right side of the tuner as shown in Figure 1, but with the parts in the opposite extreme position to that shown in Figure 2.

As will be obvious from the previous description, the tuning means provides first a preset manual machanical tuning from a number of buttons, for example four, which can be previously adjusted to the frequencies of four favorite stations. Depression of any one of these buttons 46 will bring the adjustable cam on that particular slide assembly 42 into engagement with the rod assembly 26—27 and immediately move that to the proper position to receive the desired station. Secondly, rotation of the knob 94 on the shaft 102, which projects from the right-hand side of the tuner, will cause the worm 100 to drive the gear wheel 98 and, through the clutch members 56—58, turn the rod assembly 26—27 to any desired manually adjusted position. Lastly, if it is desired to signal tune the radio, the bar 268 is depressed, energizing relay 220 to cause it to raise the detent 226 from engagement with the governor 184. When this occurs, the biased spring 122 tends to pull the saddle assembly 110 forward. Figure 6 shows the mechanism in the fully cocked position of spring 122. The saddle assembly 110, is, however, connected through a link 118 with the planetary carriage 132, and therefore tends to pull the planetary carriage forward about its pivot 164. As the planetary carriage 132 moves about its pivot, the pinion 150 will be driven, since it moves over the stationary locked gear 170. This drives the remaining gear train consisting of gear 158, pinion 172, gear 174, pinion 178, gear 180, to pinion 186 through the clutch members 152—154. This reduction gear train terminating in an air vane governor 184 slows down the movement of the saddle assembly 110 forward to a relatively slow and useable rate. The movement of the saddle assembly 110 is, however, connected through a gear 100, which in this instance no longer acts as a worm, but rather as a rack, rotating the gear 98, and through the engaged clutch 56—58, driving the tuning means. If the tuning means reaches a carrier signal, the relay 220 is deenergized, detent 226 drops into the air vane governor 184, and movement stops, the set being tuned on station.

If the tuning means reaches the foremost limit of its travel and no station has been received by the signal seeking tuner, actuation of switch 246 by pin 256 carried by the rod assembly will energize solenoid coil 228, causing the tuning means to be quickly moved to its rearmost limit of movement, where switch 246 will be thrown open by pin 258, and scanning tuning can then continue. If on the other hand the spring 122 has completed its drive of the tuning means to one limit of movement and no station has been received, then relay 124 will be energized by actuation of limit switch 270 to cause the planetary gear carriage 132 to be moved to its opposite position and spring 122 simultaneously cocked to resume scanning action. The switching means for providing this energization for the solenoid 124 is shown at 270 mounted on the side of frame member 50. This is best shown in Figure 3 and consists of an actuating arm 272, causing snapover movement of the switch to remain in the last actuated position. The actuating arm is thrown by two adjustable lugs 274 and 276 mounted on the side of the planetary carriage. Thus when the planetary carriage reaches a position at which the spring 122 is completely discharged, the actuating arm 272 is moved by lug 276 to close a circuit for the cocking solenoid 124 which, when energized, draws in its core 126 to pull the planetary carriage clockwise as shown in Figure 3 through the pin 192 riding in the slot 130 of the slide 128. As soon as the planetary carriage 132 has assumed its opposite position in which the spring 122 is loaded, the other lug 274 throws the switch actuator 272 in the opposite direction and opens the circuit to the solenoid coil 124. The deenergization of the solenoid coil allows core 126 to move back out to a deenergizated position and the slot 130 permits it to do so. This is required because in the energized position of coil 124 the clutch actuating transverse bar 84 is moved to clutch actuating position and clutch 56—58 opened so that the tuning means will not be moved, as previously described, and bar 84 must be released to permit clutch engagement.

By this mechanism, therefore, all three types of tuning are provided without the necessity of the operator having to press any selector means. If mechanical push button preset stations are desired, any one of the buttons 46 are depressed. If signal seeking action is desired, the bar 268 is depressed, and if manual tuning is desired, the knob on shaft 102 is rotated to bring in any desired station.

We claim:

1. In radio receiving apparatus, means for tuning the apparatus over a predetermined band of frequencies, primary movable means connected to said tuning means to move the same, a plurality of independently movable means, adjustable means carried by each independently movable means separately operably engageable with the primary movable means to move the same, power driven signal actuated indexing means, means interconnecting said power driven means and the primary movable means including clutch means to disconnect the power driven means, clutch operating means actuated by each independently movable means, and manually operable means connected to said clutch means secured to the power driven means so that it may manually drive the primary movable means at all times except when the clutch is opened by movement of one of the plurality of independently movable means.

2. In radio receiving apparatus, means for tuning the apparatus over a predetermined band of frequencies, primary movable means connected to said tuning means to move the same, power actuated means engageable with said primary movable means to move the same to one limit of its travel, biasing means for moving said power actuated means out of the path of the primary movable means, and switching means mounted on the primary movable means controlling the power actuated means at determined positions of the primary movable means.

3. In radio receiving apparatus, means for tuning the apparatus over a predetermined band of frequencies, primary movable means connected to said tuning means to move the same, adjustable cam means normally positioned out of engagement with said primary movable means, but mounted for movement into engagement therewith, power driven means, clutch means interconnecting said power driven means and said primary movable means to drive the means for tuning over the frequency band, and manual means connected to said power driven means to move the tuning means as desired.

4. In radio receiving apparatus, means for tuning the apparatus over a predetermined band of frequencies, movable means rigidly connected to the tuning means, a plurality of slidable assemblies having variably positionable means thereon selectively engageable with the movable means to move the same to desired positions, clutch means connected to the movable means, manually movable means coupled to said clutch means to drive the movable means connected to the tuning means when the clutch is engaged, motive means connected to the manually movable means to independently move the same to drive the tuning means, and means actuated by the tuning in of a transmitted signal to index the motive means to stop on a station.

5. In radio receiving apparatus, means for tuning the apparatus over a predetermined band of frequencies, movable means rigidly connected to the tuning means, a plurality of slidable assemblies having variably positionable means thereon selectively engageable with the movable means to move the same to desired positions, motive driving means for the tuning means, manual driving means and common clutch means interconnecting the manual driving means and the motive driving means with the movable means connected to the tuning means to drive the latter either manually or by motive means to disconnect both when one of the slidable assemblies is actuated.

6. In radio receiving apparatus, movable means for tuning the apparatus over a predetermined band of frequencies, power storage means for moving the movable tuning means in one direction, clutch means connected between the power storage means and the movable tuning means, means for recharging the power storage means, clutch operating means connected to the means for recharging the power storage means so that when the recharging means is operating to recharge the power storage means, the latter is disconnected from the movable tuning means.

7. In radio receiving apparatus, movable means for tuning the apparatus over a predetermined band of frequencies, power storage means for moving the movable tuning means in one direction, clutch means connected between the power storage means and the movable tuning means, means for recharging the power storage means, clutch operating means connected to the means for recharging the power storage means so that when the recharging means is operating to recharge the power storage means, the latter is disconnected from the movable tuning means, and manually movable means connected to the clutch means remote from the movable tuning means to manually move the latter, but disconnect it therefrom when the clutch means is open.

8. In radio receiving apparatus, movable means for tuning the apparatus over a predetermined band of frequencies, power storage means for moving the movable tuning means in one direction, clutch means connected between the power storage means and the movable tuning means, means for recharging the power storage means, clutch operating means connected to the means for recharging the power storage means so that when the recharging means is operating to recharge the power storage means, the latter is disconnected from the movable tuning means, manually movable means connected to the clutch means remote from the movable tuning means to manually move the latter, but disconnect it therefrom when the clutch means is open, and a plurality of separately movable means carrying adjustably positionable members mounted to be moved into engagement with the movable tuning means and independently bring the movable tuning means to different predetermined mechanical positions.

9. In radio receiving apparatus, movable means for tuning the apparatus over a predetermined band of frequencies, power storage means for moving the movable tuning means in one direction, clutch means connected between the power storage means and the movable tuning means, means for recharging the power storage means, clutch operating means connected to the means for recharging the power storage means so that when the recharging means is operating to recharge the power storage means, the latter is disconnected from the movable tuning means, manually movable means connected to the clutch means remote from the movable tuning means to manually move the latter, but disconnect it therefrom when the clutch means is open, a plurality of separately movable means carrying adjustably positionable members mounted to be moved into engagement with the movable tuning means and independently bring the movable tuning means to different predetermined mechanical positions, and a second clutch actuating means engageable by the separately movable means to open the clutch when any one of the separately movable means is actuated.

10. In radio receiving apparatus, movable means for tuning the apparatus over a predetermined band of frequencies, power storage means for moving the movable tuning means in one direction, clutch means connected between the power storage means and the movable tuning means, means for recharging the power storage means, clutch operating means connected to the means for recharging the power storage means so that when the recharging means is operating to recharge the power storage means, the latter is disconnected from the movable tuning means, manually movable means connected to the clutch means remote from the movable tuning means to manually move the latter, but disconnect it therefrom when the clutch means is open, a plurality of separately movable means carrying adjustably positionable members mounted to be moved into engagement with the movable tuning means and independently bring the movable tuning means to different predetermined mechanical positions, and independent power means to move the movable tuning means from one end of its travel to the other.

11. In radio receiving apparatus, movable means for tuning the apparatus over a predetermined band of frequencies, power storage means for moving the movable tuning means in one direction, clutch means connected between the power storage means and the movable tuning means, means for recharging the power storage means, clutch operating means connected to the means for recharging the power storage means so that when the recharging means is operating to recharge the power storage means, the latter is disconnected from the movable tuning means, manually movable means connected to the clutch means remote from the movable tuning means to manually move the latter, but disconnect it therefrom when the clutch means is open, a plurality of separately movable means carrying adjustably positionable members mounted to be moved into engagement with the movable tuning means and independently bring the movable tuning means to different predetermined mechanical positions, independent power means to move the movable tuning means from one end of its travel to the other, and additional clutch actuating means on said independent power means to uncouple the power storage means and the manual means while moving the movable tuning means.

12. In radio receiving apparatus, movable means for tuning the apparatus over a predetermined band of frequencies, power storage means for moving the movable tuning means in one direction, clutch means connected between the power storage means and the movable tuning means, a plurality of energizable driving means, one coupled to the power storage means to recharge the same, and the other to the movable tuning means to move the same over the frequency band, and a plurality of switching means for the driving means actuated by the position of the power storage means and the movable tuning means to control the respective driving means.

13. In radio receiving apparatus, movable tuning means for tuning the apparatus over a predetermined band of frequencies, a pivotally connected treadle bar assembly connected to said tuning means to drive the same, a plurality of slidably mounted members, adjustable cam means on each member engageable with the treadle bar assembly to tune the receiver, a clutch connected to the treadle bar, a gear mounted on said clutch, a worm meshing with the gear and mounted for both rotational and longitudinal movement to drive the gear either as a worm or as a toothed rack.

14. In radio receiving apparatus, movable tuning means for tuning the apparatus over a predetermined band of frequencies, a pivotally connected treadle bar assembly connected to said tuning means to drive the same, a plurality of slidably mounted members, adjustable cam means on each member engageable with the treadle bar assembly to tune the receiver, a clutch connected to the treadle bar, a gear mounted on said clutch, a worm meshing with the gear and mounted for both rotational and longitudinal movement to drive the gear either as a worm or as a toothed rack, manual means for rotating said worm connected thereto, and power means connected to said worm for moving the same longitudinally.

15. In radio receiving apparatus, movable tuning means for tuning the apparatus over a predetermined band of frequencies, a pivotally connected treadle bar assembly connected to said tuning means to drive the same, a plurality of slidably mounted members, adjustable cam means on each member engageable with the treadle bar assembly to tune the receiver, a clutch connected to the treadle bar, a gear mounted on said clutch, a worm meshing with the gear and mounted for both rotational and longitudinal movement to drive the gear either as a worm or as a toothed rack, manual means for rotating said worm connected thereto, power means connected to said worm for moving the same longitudinally, said power means including a spring drive to move the worm longitudinally in one direction and a solenoid to move the worm in the opposite direction, gear train load means connected to the spring drive to limit the speed of movement of the worm when moved by the spring, and indexing means associated with the gear train to index the tuner.

References Cited in the file of this patent

UNITED STATES PATENTS

| | | |
|---|---|---|
| 2,346,399 | Schwarz et al. | Apr. 11, 1944 |
| 2,494,008 | Schwarz et al. | Jan. 10, 1950 |
| 2,494,235 | Gierwiatowski | Jan. 10, 1950 |
| 2,499,967 | Nicholson Jr. | Mar. 7, 1950 |
| 2,512,714 | Carlzen | June 27, 1950 |
| 2,513,353 | Owens | July 4, 1950 |
| 2,701,330 | Schwarz et al. | Feb. 1, 1955 |
| 2,706,787 | Sperber | Apr. 19, 1955 |
| 2,744,193 | Schwarz | May 1, 1956 |

UNITED STATES PATENT OFFICE
CERTIFICATE OF CORRECTION

Patent No. 2,852,944 September 23, 1958

George M. Gaskill et al.

It is hereby certified that error appears in the printed specification of the above numbered patent requiring correction and that the said Letters Patent should read as corrected below.

Column 5, line 67, for "in provided" read -- is provided --; column 7, line 44, for "is, however, connected through a" read -- forward carries with it the worm --; column 8, line 10, for "energizated" read -- energized --.

Signed and sealed this 13th day of January 1959.

(SEAL)
Attest:

KARL H. AXLINE

Attesting Officer

ROBERT C. WATSON
Commissioner of Patents